United States Patent
Gauvrit et al.

(10) Patent No.: US 11,747,386 B2
(45) Date of Patent: Sep. 5, 2023

(54) AUTOMATIC DETECTION OF A HARDWARE CONFIGURATION OF A PIECE OF EQUIPMENT LOCATED ON-BOARD AN AIRCRAFT

(71) Applicant: SAFRAN AIRCRAFT ENGINES, Paris (FR)

(72) Inventors: Jacques Paul Michel Gauvrit, Moissy-Cramayel (FR); Davy Philippe Masson, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 0 days.

(21) Appl. No.: 17/631,873

(22) PCT Filed: Jul. 31, 2020

(86) PCT No.: PCT/FR2020/051412
§ 371 (c)(1),
(2) Date: Jan. 31, 2022

(87) PCT Pub. No.: WO2021/019190
PCT Pub. Date: Feb. 4, 2021

(65) Prior Publication Data
US 2022/0283213 A1   Sep. 8, 2022

(30) Foreign Application Priority Data

Jul. 31, 2019 (FR) ........................ 1908730

(51) Int. Cl.
*G01R 31/00* (2006.01)
*G01R 19/00* (2006.01)
*G01R 19/165* (2006.01)

(52) U.S. Cl.
CPC ....... *G01R 31/008* (2013.01); *G01R 19/0092* (2013.01); *G01R 19/165* (2013.01)

(58) Field of Classification Search
CPC .......... G01R 31/008; G01R 19/0092; G01R 19/165; G01R 31/72; H01F 7/1844; H01F 2007/1855; F02C 7/232; G01M 15/14

(Continued)

(56) References Cited

U.S. PATENT DOCUMENTS 5,997,360 A    12/1999 Gen-kuong et al.
2015/0219460 A1*  8/2015 Gmerek .................. G01S 19/15
                                                              701/468

(Continued)

OTHER PUBLICATIONS

International Patent Application No. PCT/FR2020/051413, International Search Report and Written Opinion dated Jan. 20, 2021, 15 pgs.

(Continued)

*Primary Examiner* — Farhana A Hoque
(74) *Attorney, Agent, or Firm* — Cozen O'Connor

(57) ABSTRACT

The invention relates to a method for detecting a hardware configuration of an on-board device in an aircraft, capable of receiving as input a setpoint current (Ic), and of producing as output a response current (I), the method comprising the following steps:
a) Send, to the input of the device, a setpoint current (Ic) at a given time ($t_0$);
b) Measure one or more values of the response current (I) at the output of the device in a measurement-time interval defined between two instants ($t_1$ and $t_2$) after the initial instant ($t_0$);
c) Infer the hardware configuration of the device, doing so from one or more values of the response current (I) measured.

19 Claims, 3 Drawing Sheets

(58) Field of Classification Search
USPC .......................................................... 324/503
See application file for complete search history.

(56) References Cited

U.S. PATENT DOCUMENTS

| | | |
|---|---|---|
| 2016/0092192 A1 | 3/2016 | Frayssignes et al. |
| 2016/0245144 A1 | 8/2016 | Selberg et al. |
| 2017/0109946 A1* | 4/2017 | Goupil ............... B64D 45/0005 |

OTHER PUBLICATIONS

French Patent Application No. 1908730; Search Report dated May 19, 2020; 2 pgs.

* cited by examiner

Fig. 4A
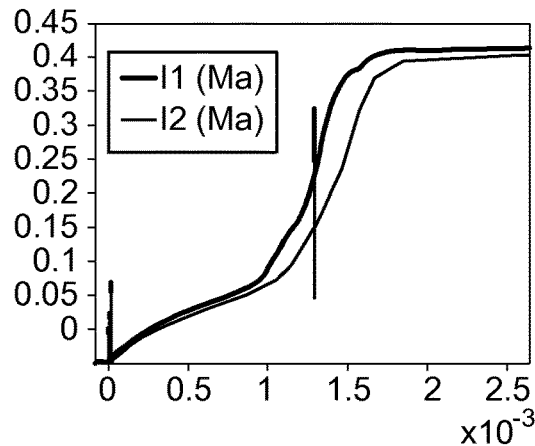
Fig. 4B
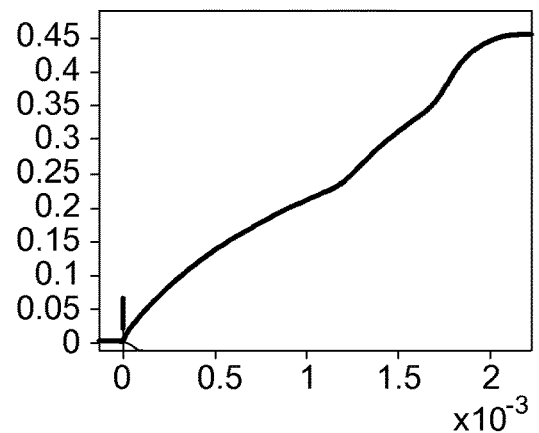
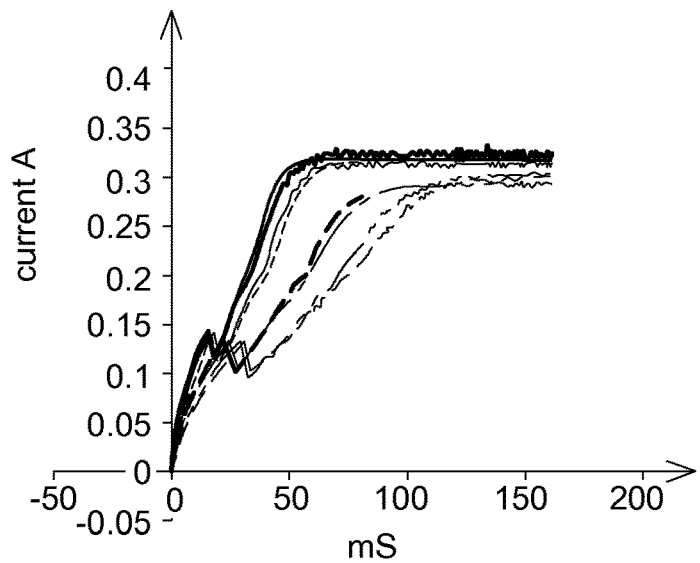
Fig. 5A
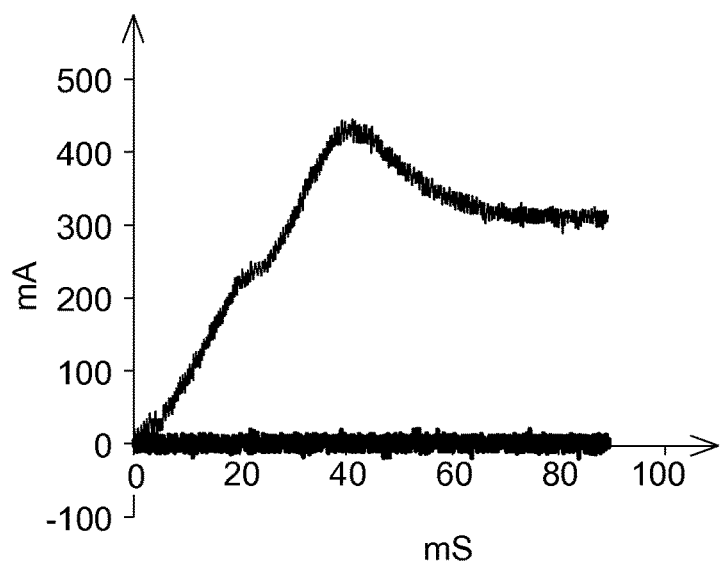
Fig. 5B

AUTOMATIC DETECTION OF A HARDWARE CONFIGURATION OF A PIECE OF EQUIPMENT LOCATED ON-BOARD AN AIRCRAFT

CROSS-REFERENCE TO RELATED APPLICATIONS

This application is a 35 U.S.C. §371 filing of International Application No. PCT/FR2020/051412 filed Jul. 31, 2020, which claims the benefit of priority to French Patent Application No. 1908730 filed Jul. 31, 2019, each of which is incorporated herein by reference in its entirety.

TECHNICAL FIELD OF THE INVENTION

The invention relates to on-board devices in an aircraft, in particular fuel-regulation devices, especially for a turbomachine such as a turbojet or turboprop engine.

PRIOR ART

There are several on-board calculators in aircraft aimed at supervising the various on-board devices, in order to ensure their proper functioning. In particular, any devices where a malfunction would be critical requires supervision by two calculators, one of the calculators dedicated to redundancy and used in the event of the other calculator malfunctioning. The two calculators usually form two channels of a control unit known as an EPMU (electronic and protection monitor unit).

These calculators are also called protection calculators. One of their tasks is to prevent the flow of fuel to the turbomachine if a malfunction is identified, so as to avoid a catastrophic event.

From one turbomachine model to another, depending on their architecture, the protection calculators can be required to control fuel metering and regulation devices (FMU for Fuel Metering Unit). For example, if turbomachine overspeed is detected, the EPMU sends a command to the FMUs to control and/or reduce fuel injection.

There are different models of regulation devices, with different hardware characteristics, and thus in particular requiring different control currents.

It is also possible, during maintenance operations, to replace a first FMU model with a second FMU model. Sending too high a control current could damage the device, and sending too low a control current can affect the protection of the turbomachine in the event of a malfunction.

At the current time, information about the turbomachine architecture, i.e. the number, positioning and FMU model used, is entered into the protection application software run by the protection calculators.

Thus, a modification of the FMU model, during a maintenance operation, requires a modification of the protection application software to avoid any operating problems.

The purpose of the invention is in particular to provide a simple, effective and economical solution to the problems of the prior art described above.

SUMMARY OF THE INVENTION

To this end, a method is proposed for detecting a hardware configuration of an on-board device in an aircraft, capable of receiving as input a setpoint current Ic and of producing as output a response current I, the method comprising the following steps:

a) Send, to the input of the device, a setpoint current Ic at a given time $t_0$;
b) Measure one or more values of the response current I at the output of the device in a measurement-time interval defined between two instants $t_1$ and $t_2$ after the initial instant $t_0$;
c) Infer the hardware configuration of the device, doing so from one or more values of the response current I measured.

The inference of the hardware configuration of the device can be made from one or more values of the current I measured and the electrical current response characteristics of the device.

When the device is, for example, an FMU, such a method, implemented on a protection calculator, makes it possible, during a phase of powering up the devices, i.e. when the latter are starting up, to automatically detect the FMU model connected to the protection calculators, and therefore to adapt the control current to each FMU model.

Thus, based on the electrical characteristics of the FMU models, it is possible to infer their models. For this purpose, the current response to a control current is analysed in order to automatically infer, i.e. without human intervention, the hardware configuration of each device. The term 'analysed' means that the value of the output current of the device in response to the control current, as well as the temporal variation of the output current, is analysed.

Thus, by performing a discriminatory test of the configuration, the solution ensures the control of devices of heterogeneous hardware configuration, while guaranteeing the function of protection against unexpected malfunctions of the turbomachine (Hazardous Engine Effects). The invention is applicable to any device comprising an electric actuator comprising a coil, and therefore having an inductance. For example, in the case of an FMU, the invention is applicable thanks to the presence of an electro-hydraulic servovalve (EHSV) allowing the control of the fuel-metering valve (FMV).

In addition, the hardware configuration of a device can be at least one of the following configurations:
a first device having a first inductance $L_1$;
a second device having a second inductance $L_2$;
a device of unknown hardware configuration, and wherein $L_2 = x \cdot L_1$ où $x \in \mathbb{R}$ and $x \geq 10$.

Thus, device with an L1 inductance between 50 mH and 150 mH is considered to be a low-inductance device. A device with an L2 inductance of between 0.9 H and 1.5 H is considered to be high-inductance device.

Step c) can consist of comparing the one or more values of the response current measured with a first threshold I measured at a first threshold $I_{min1,FMU1}$ and at a second threshold $I_{max2,FMU2}$ lower than the first threshold, so that:
a first device is detected, if the values of the measured current I are higher than the first threshold $I_{min1,FMU1}$;
a second device is detected, if the values of the measured current I are lower than the second threshold $I_{max2,FMU2}$;
a device of unknown hardware configuration is detected if the values of the measured current I are between the second threshold and the first threshold.

Consequently, by acquiring the current, the method compares the value of the current measured with the minimum value of the output current of the first device and with the maximum value of the output current of the second device, at the same instant t, in response at the same control current.

In addition, the method can also comprise the following step:

measure one or more values of the response current I at at least one time $t_3$ after an upper bound value $t_2$, of the measurement time interval, and infer that the hardware configuration is that of a first defective device or that of a second defective device if the values of the measured response current/are lower than a third threshold ($I_{min\ 3}$).

A third threshold thus allows for the further identification of a first or second faulty device. The hardware configurations of the first and second device can have the same resistance value.

Preferably, the first inductance $L_1$ can be of the order of 100 mH and the second inductance $L_2$ can be of the order of 1H.

In addition, the response current of the device can be expressed as:

$$I = Ic\left(1 - e^{-\frac{t}{\sigma}}\right) avec\ \sigma = \frac{L}{R}$$

where, L is the impedance of the device and R is the resistance of the device.

Depending on the value of the current measured at the output of the device, and knowing the resistance of the device, regardless of its structure, it is possible to determine the hardware configuration of the device automatically.

In other words, the response time of the device to a control current sent by the calculator allows the latter to identify, for each device, its hardware configuration in an automatic manner, when it starts up. Thus, the protection calculator can then adapt the levels of these control currents for each of the devices according to its hardware configuration, i.e. its model.

Alternatively, the setpoint current can be sent by an on-board protection calculator of the aircraft. The setpoint current Ic can be of the order of 400 mA.

Depending on the values of the currents measured $I_1$, $I_2$ at times $t_1$ and $t_2$, it is possible to characterise the response of the device to the control current, in particular its response time.

The measurement of the current value at two points in time $t_1$ and $t_2$ ensures a certain robustness of the method with regard to the environmental variability that can impact the time of the device.

In particular, steps a) to c) can be carried out when the device is switched on.

In addition, the device can comprise an actuator of a moving member of a fuel-metering unit, said actuator comprising at least one fixed electrical coil and a moving core. Indeed, there are at least two types of fuel-metering units with different material configurations, which as detailed above, are characterised by low or high impedance. This is because the electrohydraulic servo valves (EHSVs) for controlling the fuel-metering valve (FMV) used in the two FMU models have different impedances. Thanks to the invention, a first type of fuel-metering unit can be replaced by a second type of fuel-metering unit during maintenance work, without the risk of a control current with an unsuitable level being fed to it. The adaptation of the current level sent by the protection calculator(s) is then done automatically.

The present document also relates to a calculator program comprising instructions for implementing the method as described above, when executed on a processor.

The present document also relates to a protection calculator comprising a processor coupled to a memory such that the aforementioned program is stored on the memory. Also, the present document relates to a protection calculator comprising a processor coupled to a memory on which are stored instructions for implementing the method as aforesaid when executed on the calculator.

BRIEF DESCRIPTION OF THE FIGURES

FIG. 4A is a curve showing the maximum and minimum output currents of a fuel-metering unit of a first model in response to a setpoint current;

FIG. 4B is a curve representing the output currents of the first model when a short circuit occurs on one of the channels of the control unit;

FIG. 5A is a curve showing the maximum and minimum output currents of a fuel-metering unit of a first model in response to a setpoint current;

FIG. 5B is a curve representing the output currents of the first model when a short circuit occurs on one of the channels of the control unit;

DETAILED DESCRIPTION OF THE INVENTION

During maintenance operations, the replacement of a Fuel Metering Unit (FMU) does not necessarily imply an identical replacement, so that an FMU with a first hardware configuration can be replaced by an FMU with a second hardware configuration different from the first hardware configuration.

Two models of metering units are in use today, each with its own unique hardware configuration.

The first model, known as FMU Cutback, has a first inductance L1, of the order of 100 mH. Generally speaking, the first inductance of this first model is between 0 mH and 150 mH.

The second model, known as FMU Baseline, has a second inductance L2, of the order of 1 H. Generally speaking, the second inductance of this second model is between 0.9 H and 1.5 H. These two material configurations have the same resistance. Nevertheless, the resistance of these FMUs is strongly dependent on the temperature undergone by the FMU. Therefore, the resistance of this devices exhibits a high variability depending on the resistance tolerance as well as the temperature of the environment in which the FMUs are integrated.

Thus, in general, the inductances L1 and L2 are referred to as low and high inductances respectively, and these inductances can be expressed as $L_2 = x \cdot L_1$ où $x \in \mathbb{R}$ and $x \geq 10$.

Figure 1:
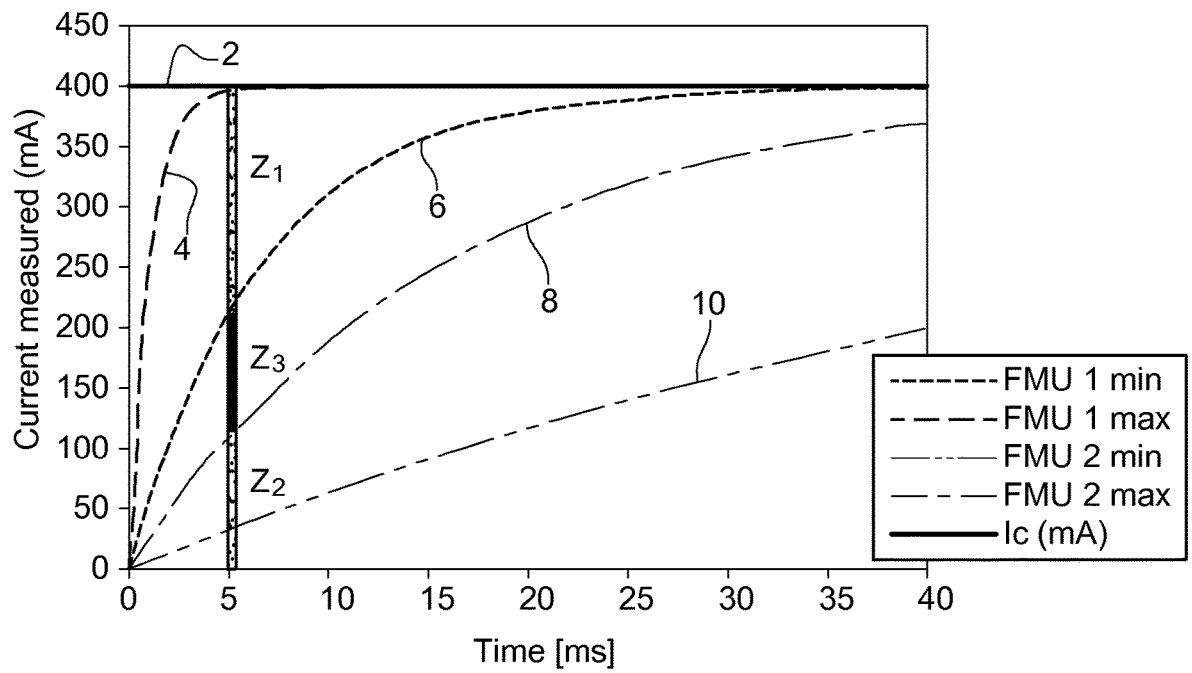
FIG. 1 shows the temporal evolution of the maximum and minimum output currents of a first and second fuel metering unit model in response to a control current of the order of 400 mA.

FIG. 1 illustrates the current response of the first FMU1 model and of the second FMU2 model to a setpoint current 2 of the order of 400 mA.

The current response of the first FMU1 model to this setpoint current is between a curve of the maximum output current 4 and a curve of the minimum output current 6. This variation in output current depends on the temperature to which the fuel metering unit is subjected.

The current response of the first FMU2 model to this setpoint current is between a curve of the maximum output current 8 and a curve of the minimum output current 10.

In general, the output current of the device is expressed as:

$$I = Ic\left(1 - e^{-\frac{t}{\sigma}}\right) \text{ avec } \sigma = \frac{L}{R}$$

where, L is the impedance of the device and R is the resistance of the device, the resistance being variable depending on the temperature to which the FMU is subjected.

Thus, two zones Z1 and Z2 are delimited, the first zone Z1 representing all the values that can be taken by the output currents of the first model FMU1 and the second zone Z2 representing all the values that can be taken by the output currents of the second model FMU2. As can be seen in FIG. 1, these zones Z1, Z2 do not overlap. The detection method according to the invention relies on this last point to allow automatic detection of the FMU model used.

Figure 2:
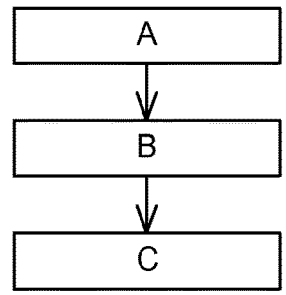
FIG. 2 is a flow chart of the method of detecting a hardware configuration of an on-board device in an aircraft according to a first embodiment.

FIG. 2 illustrates an embodiment of a method for detecting a hardware configuration of an on-board device, in this case a fuel-metering unit, in an aircraft.

As detailed with reference to FIG. 1, the two fuel-metering unit models FMU1 and FMU2 are adapted to receive a setpoint current as an input Ic. and, in response to this setpoint current, to produce an output current I.

The metering unit is embedded in an environment, where it is supervised by a two-channel control unit, EPMU, i.e. with two calculators for redundancy of protection. These two calculators, for example made up of two electronic cards in the same housing, are connected to the same FMU, so that in the event of a malfunction of one unit, the control of the fuel metering unit is ensured by the remaining healthy calculator. The first step A of the method consists of sending a setpoint current to the input of the device Ic at a given time $t_0$.

Figure 3:
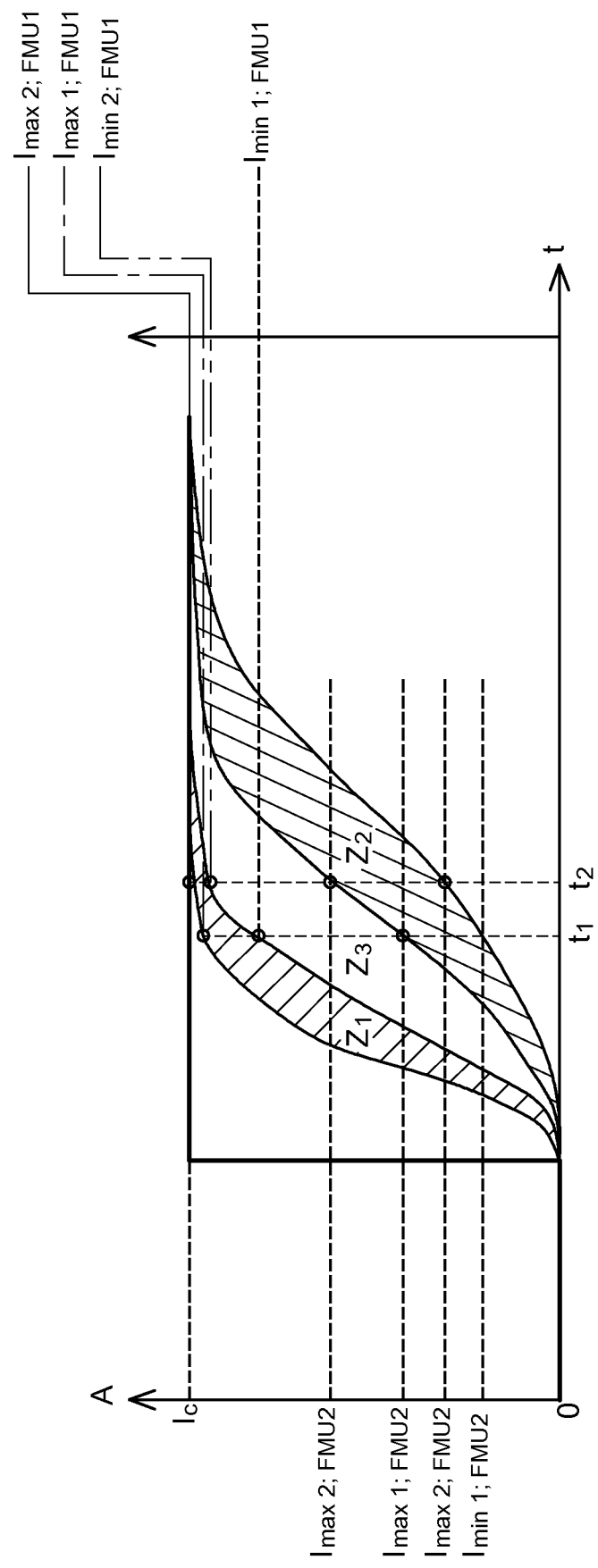
FIG. 3 shows the measurements carried out in the method according to a first embodiment.

As can be seen from the example in FIG. 3, the setpoint current Ic is a direct current, issued from $t_0=0$ ms.

The second step B of said method consists in measuring the values of the current $I_1$ and $I_2$ at the output of the device at times $t_1$ and $t_2$ after $t_0$.

During this second step, for example, two measurements of the current response (not shown in FIG. 3) at the output of the current device are taken at two times $t_1$ and $t_2$ after $t_0$.

The moments $t_1$ and $t_2$ are chosen for example around 5 ms, so as to define a measurement time interval of for example less than 1 ms as illustrated schematically in FIG. 1.

As shown in the diagram, depending on the current values measured in the measurement time interval between $t_1$ and $t_2$, the hardware configuration of the fuel-metering unit can be inferred in a third step C.

For example, by measuring a response current $I_1$ at time $t_1$ and $I_2$ at time $t_2$, the inference is based on comparing the values $I_1$, $I_2$ with the following ranges:

comparison of $I_1$ at time $t_1$ and $I_2$ at time $t_2$:

if $I_1 \in [I_{min\ 1;FMU1};\ I_{max\ 1;FMU1}]$ and $I_2 \in [I_{min\ 2;FMU1};\ I_{max\ 2;FMU1}]$, i.e. at zone Z1, then the fuel-metering unit has the hardware configuration of the first model FMU 1;

if $I_1 \in [I_{min\ 1;FMU2};\ I_{max\ 1;FMU2}]$ and $I_2 \in [I_{min\ 2;FMU2};\ I_{max\ 2;FMU2}]$, i.e. at zone Z2, then the fuel-metering unit has the material configuration of the second model FMU2.

In other words, this comparison allows the response time of the fuel-metering unit to be characterised and compared with the known response time of the first and second models.

As can be seen, if $I_1 \in [I_{max\ 1;FMU2};\ I_{min\ 1;FMU1}]$ and $I_2 \in [I_{max\ 2;FMU2};\ I_{min\ 2;FMU1}]$ i.e. at zone Z3, then it is impossible to determine the material configuration of the fuel-metering unit. When the method is implemented on the ECU, an error message is returned.

Of course, it is possible to limit the method to the measurement of a single value of the output current at a time t within the measurement time interval between $t_1$ and $t_2$ and to infer the hardware configuration of the device, depending on the value of the measured current I. In other words, to identify in which zone Z1 or Z2 the measured current is located I is located.

A third measurement at the time $t_3$ can be useful, for example, if a short circuit occurs in one of the EPMU channels. This time $t_3$ identified in FIG. 3 is later than the time $t_2$ This time, identified in FIG. 3, is later than the time at which the current is detected, and allows the identification of currents lower than the output current of the zone Z2, in the zone Z4, which then correspond to first or second device with material faults. In this case, as can be seen in FIGS. 4B and 5B, the output currents of the fuel metering unit are impacted in response to a control current of the order of 400 mA. By comparing the output current value at time $t_3$ to a third threshold $I_{min\ 3}$, it is possible to detect a faulty device.

An example of a device fault is an actuator drift where the response time of the actuator is outside a predefined range when subjected to a current load. Another example of a fault could be a short circuit in a coil of a two-coil actuator.

Nevertheless, as in the cases described above, the evolution of the output current of the fuel-metering unit remains similar to the case without short circuit.

Indeed, as can be seen in FIG. 4A, in response to a setpoint current of, say, 400 mA, the output current of the first model FMU1 reaches 400 mA between 1.5 ms and 2 ms (depending on the temperature of the fuel-metering unit environment), assuming that the setpoint current is issued from t=0 ms. In case of a short circuit the value of 400 mA is reached at 2 ms as shown in FIG. 4B. Thus, despite a short circuit on one of the channels of the control unit, the test of the output current value remains discriminating.

This is also confirmed for the second hardware configuration. Indeed, as can be seen in FIG. 5A, the output current of the second model FMU2 reaches 300 mA between 50 and 120 ms (depending on the temperature of the fuel metering unit environment), considering that the set current of 400 mA is emitted from $t_0=0$ ms. In case of a short circuit, the value of 300 mA is reached at about 30 ms as shown in FIG. 5B. Thus the response time is about 15 times longer than the response time of the first configuration, as in the case without short circuit.

Thus, whether or not there is a short circuit, a current measurement at two times around 2 ms, for example at times $t_1$ and $t_2$ between 0 ms and 2 ms can be used to infer the hardware configuration of the fuel-metering unit. Indeed, if the measured value $I_1$ value is in the range corresponding to the Z3 zone, values for which the hardware configuration cannot be inferred, but $I_2$ is in the range $[I_{min\ 2;FMU1};\ I_{max\ 2;FMU1}]$ or $[I_{min\ 2;FMU2};\ I_{max\ 2;FMU2}]$, then it can still be inferred that the fuel-metering unit has the same hardware configuration as either the first model FMU1 or the second model FMU2.

Preferably, the method is performed by the control unit when the device is switched on. In particular, this method is carried out by each of the protection calculators of the control unit.

To this end, the protection calculators, comprising a processor coupled to a memory, contain in memory a calculator program comprising instructions for implementing the method as described above when executed on a processor.

The invention claimed is:

1. A method for detecting a hardware configuration of an on-board device in an aircraft, capable of receiving as input a setpoint current (Ic), and of producing as output a response current (I), the method comprising the following steps:
   a) Send, to the input of the on-board device, a setpoint current (Ic) at a given initial time ($t_0$);
   b) Measure one or more response current values (I) at the output of the on-board device in a measurement-time interval defined between two instants ($t_1$, $t_2$) after the initial instant ($t_0$);
   c) Infer the hardware configuration of the on-board device, doing so from the one or more measured response current values (I) and electrical current-response characteristics of the on-board device.

2. The method according to claim 1, wherein the hardware configuration of the on-board device is at least one of the following configurations:
   a first device having a first inductance $L_1$;
   a second device having a second inductance $L_2$; or
   a device of unknown hardware configuration, and wherein
   $L_2 = x \cdot L_1$ où $x \in \mathbb{R}$ and $x \geq 10$.

3. The method according to claim 2, wherein step c) comprises comparing the one or more values of the response current (I) measured at a first threshold ($I_{min1,FMU1}$) and at a second threshold ($I_{max2,FMU2}$) lower than the first threshold, such that:
   a first device is detected, if the values of the measured response current (I) are higher than the first threshold ($I_{min1,FMU1}$),
   a second device is detected, if the values of the measured response current (I) are lower than the second threshold ($I_{max2,FMU2}$),
   a device of unknown hardware configuration is detected if the values of the measured current I are between the second threshold and the first threshold.

4. The method according to claim 1, further comprising the following step:
   measure one or more values of the response current (I) at least one time ($t_3$) after an upper bound value ($t_2$) of the measurement-time interval, and
   infer that the hardware configuration is that of a first defective device or that of a second defective device if the values of the measured response current (I) are lower than a third threshold ($I_{min\ 3}$).

5. The method according to claim 2, wherein the hardware configuration of the first device and the hardware configuration of the second devices have a same resistance value.

6. The method according to claim 2, wherein the first inductance $L_1$ is of the order of 100 mH and the second inductance $L_2$ is of the order of 1H.

7. The method according to claim 1, wherein the response current (I) at the output of the on-board device is expressed as:

$$I = Ic\left(1 - e^{-\frac{t}{\sigma}}\right) \text{ where } \sigma = \frac{L}{R}$$

wherein, L is the impedance of the on-board device and R is the resistance of the on-board device.

8. The method according to claim 1, wherein the setpoint current (Ic) is sent by an on-board protection calculator of the aircraft.

9. The method according to claim 1, wherein steps a) to c) are performed when the device is powered up.

10. A protection calculator comprising a processor coupled to a memory on which are stored instructions for implementing the method of claim 1 when executed on the protection calculator.

11. A method for detecting a hardware configuration of an on-board device in an aircraft, capable of receiving as input a setpoint current (Ic), and of producing as output a response current (I), the method comprising the following steps:
   a) Send, to the input of the device, a setpoint current (Ic) at a given initial time ($t_0$);
   b) Measure one or more response current values (I) at the output of the device in a measurement-time interval defined between two instants ($t_1$, $t_2$) after the initial instant ($t_0$);
   c) Infer the hardware configuration of the device, doing so from the one or more measured response current values (I) and electrical current-response characteristics of the device;
   d) Measure one or more values of the response current (I) at least one time ($t_3$) after an upper bound value ($t_2$) of the measurement-time interval; and
   e) Infer that the hardware configuration is that of a first defective device or that of a second defective device if the values of the measured response current (I) are lower than a third threshold ($I_{min3}$).

12. The method according to claim 11, wherein the hardware configuration of the on-board device is at least one of the following configurations:
   a first device having a first inductance $L_1$;
   a second device having a second inductance $L_2$; or
   a device of unknown hardware configuration, and wherein
   $L_2 = x \cdot L_1$ where $x \in \mathbb{R}$ and $x \geq 10$.

13. The method according to claim 12, wherein step c) comprises comparing the one or more values of the response current (I) measured at a first threshold ($I_{min1,FMU1}$) and at a second threshold ($I_{max2,FMU2}$) lower than the first threshold, such that:
   a first device is detected, if the values of the measured response current (I) are higher than the first threshold ($I_{min1,FMU1}$),
   a second device is detected, if the values of the measured response current (I) are lower than the second threshold ($I_{max2,FMU2}$),
   a device of unknown hardware configuration is detected if the values of the measured current I are between the second threshold and the first threshold.

14. The method according to claim 12, wherein the hardware configuration of the first device and the hardware configuration of the second device have a same resistance value.

15. The method according to claim 12, wherein the first inductance $L_1$ is of the order of 100 mH and the second inductance $L_2$ is of the order of 1H.

16. The method according to claim 11, wherein the response current (I) at the output of the on-board device is expressed as:

$$I = Ic\left(1 - e^{-\frac{t}{\sigma}}\right) \text{ where } \sigma = \frac{L}{R}$$

wherein, L is the impedance of the on-board device and R is the resistance of the on-board device.

17. The method according to claim 11, wherein the setpoint current (Ic) is sent by an on-board protection calculator of the aircraft.

18. The method according to claim 11, wherein steps a) to c) are performed when the device is powered up.

19. A protection calculator comprising a processor coupled to a memory on which are stored instructions for implementing the method of claim 11 when executed on the protection calculator.

* * * * *